United States Patent
Shibuya

(10) Patent No.: US 10,566,269 B2
(45) Date of Patent: Feb. 18, 2020

(54) LOW STRESS INTEGRATED CIRCUIT PACKAGE

(71) Applicant: Texas Instruments Incorporated, Dallas, TX (US)

(72) Inventor: Makoto Shibuya, Beppu (JP)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/845,777

(22) Filed: Dec. 18, 2017

(65) Prior Publication Data

US 2019/0189543 A1    Jun. 20, 2019

(51) Int. Cl.
| | |
|---|---|
| *H01L 23/495* | (2006.01) |
| *H01L 23/31* | (2006.01) |
| *H01L 23/00* | (2006.01) |
| *H01L 23/29* | (2006.01) |
| *H01L 21/48* | (2006.01) |
| *H01L 21/56* | (2006.01) |

(52) U.S. Cl.
CPC .... *H01L 23/49541* (2013.01); *H01L 21/4821* (2013.01); *H01L 21/565* (2013.01); *H01L 23/293* (2013.01); *H01L 23/3107* (2013.01); *H01L 23/49503* (2013.01); *H01L 23/49537* (2013.01); *H01L 24/32* (2013.01); *H01L 24/83* (2013.01); *H01L 24/48* (2013.01); *H01L 24/73* (2013.01); *H01L 24/85* (2013.01); *H01L 24/92* (2013.01); *H01L 2224/32245* (2013.01); *H01L 2224/48091* (2013.01); *H01L 2224/48247* (2013.01); *H01L 2224/73265* (2013.01); *H01L 2224/92247* (2013.01); *H01L 2924/0665* (2013.01); *H01L 2924/07025* (2013.01); *H01L 2924/14* (2013.01)

(58) Field of Classification Search
CPC ......... H01L 23/49537; H01L 23/49541; H01L 23/49503; H01L 23/31; H01L 23/3107; H01L 23/3135; H01L 23/3192
USPC .................................................. 257/676, 787
See application file for complete search history.

(56) References Cited

U.S. PATENT DOCUMENTS

| | | | | |
|---|---|---|---|---|
| 4,878,106 | A | * | 10/1989 | Sachs .................. H01L 23/3121 257/796 |
| 4,994,895 | A | * | 2/1991 | Matsuzaki .......... H01L 23/3107 257/674 |
| 5,389,817 | A | * | 2/1995 | Imamura ............. H01L 23/3107 257/666 |
| 5,654,585 | A | * | 8/1997 | Nishikawa ........ H01L 23/49548 257/666 |
| 5,917,242 | A | * | 6/1999 | Ball .................... H01L 23/4952 257/668 |
| 5,986,333 | A | * | 11/1999 | Nakamura ........ H01L 23/49503 257/667 |
| 6,025,640 | A | * | 2/2000 | Yagi .................... H01L 21/4828 257/666 |
| 6,191,490 | B1 | * | 2/2001 | Huang ............. H01L 23/49503 257/447 |

(Continued)

*Primary Examiner* — Nitin Parekh
(74) *Attorney, Agent, or Firm* — Dawn Jos; Charles A. Brill; Frank D. Cimino

(57) ABSTRACT

In a described example, an integrated circuit (IC) package includes: an IC chip bonded to a chip mount pad on a lead frame; low modulus molding compound surrounding the IC chip; and IC package molding compound covering the IC chip, and at least a portion of the low modulus molding compound.

18 Claims, 13 Drawing Sheets

(56) References Cited

U.S. PATENT DOCUMENTS 8,816,482 B2 * 8/2014 Sirinorakul ........... H01L 21/565
257/673
2016/0358838 A1 * 12/2016 Basler ............... H01L 23/49861

* cited by examiner

LOW STRESS INTEGRATED CIRCUIT PACKAGE

TECHNICAL FIELD

This disclosure relates generally to integrated circuit (IC) packaging, and more particularly to formation of a low stress IC package.

BACKGROUND

Individual IC chips (a semiconductor die without packaging is referred to herein as a "chip") are typically packaged by bonding the IC chip to a lead frame and then encapsulating the IC chip and lead frame in an IC package molding compound such as epoxy or polyimide. These IC package molding compounds typically have a modulus in the range of about 30,000 to 50,000 Mega Pascals (MPa).

The IC package molding compound is injected into a mold containing the lead frame and IC chip. After the molding compound cools the packaged IC (PIC) is removed from the mold. During curing and cooling the package molding compound of the PIC shrinks and in shrinking applies compressive stress to the transistors in the PIC. The compressive stress enhances the performance of the p-type metal-oxide-semiconductor (PMOS) transistors and degrades the performance of n-type metal-oxide-semiconductor (NMOS) transistors within the IC chip. These changes in transistor performance vary from the target specifications and can degrade the performance of the IC chip and in some cases, can cause the IC circuit to fail. IC chips with analog transistors are especially sensitive to packaging induced stress.

SUMMARY

In a described example, an integrated circuit (IC) package includes: an IC chip bonded to a chip mount pad on a lead frame; low modulus molding compound surrounding the IC chip; and IC package molding compound covering the IC chip, and at least a portion of the low modulus molding compound. A method for forming a low stress integrated circuit package with the IC chip surrounded by low modulus molding compound and covered in IC package molding compound is described.

BRIEF DESCRIPTION OF THE DRAWINGS

FIGS. 2AA through 2CC are plan views of the lower surface of the sublayers of a lead frame.

DETAILED DESCRIPTION

Corresponding numerals and symbols in the different figures generally refer to corresponding parts unless otherwise indicated. The figures are not necessarily drawn to scale.

Figure 1A:
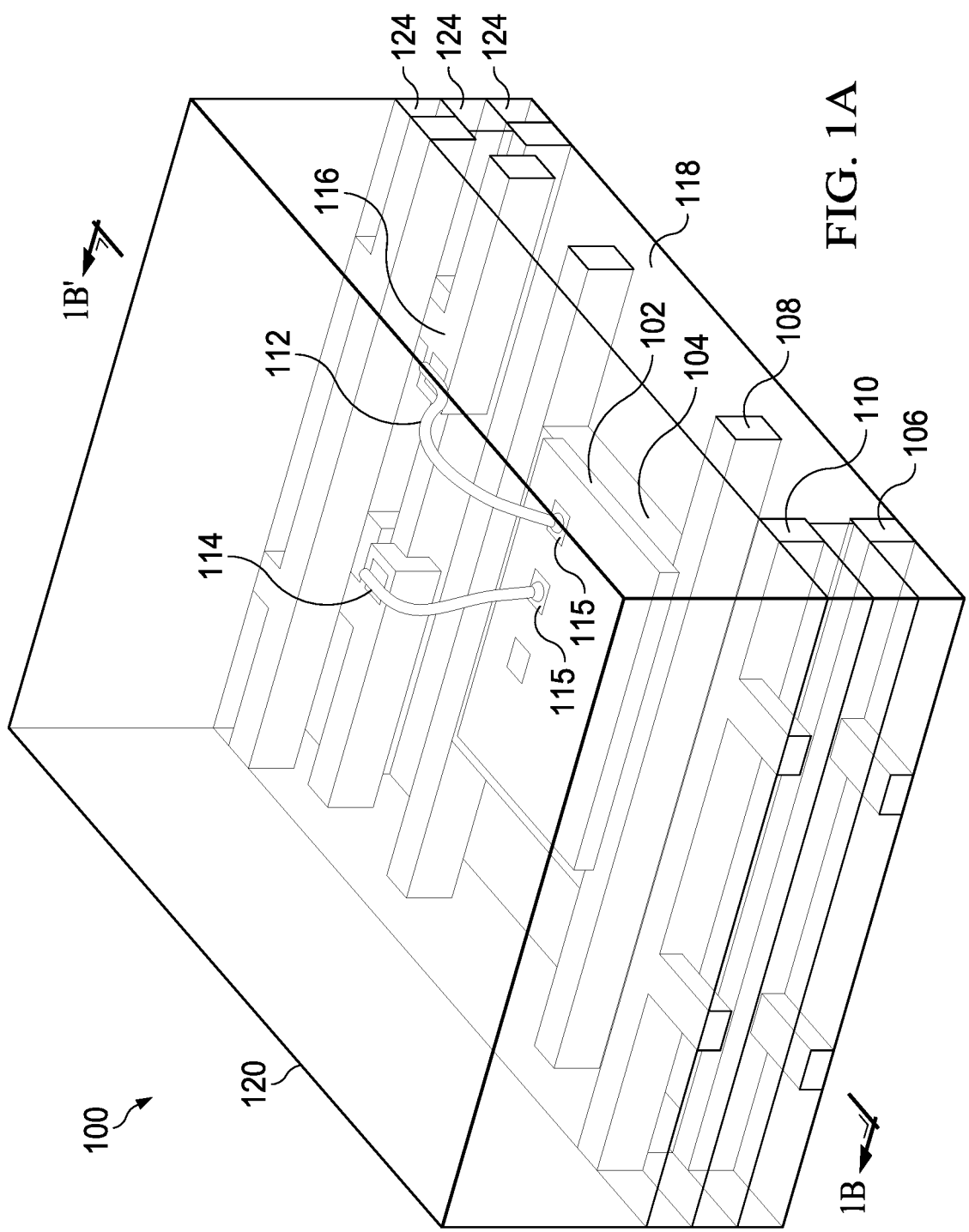
FIGS. 1A and 1B are a prospective view and cross section of a low stress packaged integrated circuit.

FIG. 1A is a perspective view of a low stress packaged integrated circuit (PIC) 100. The IC chip 102 is mounted on a lead frame chip pad 104. Wire bonds 112 and 114 electrically connect bond pads 115 on the IC chip 102 to lead frame lead pads 116. The IC chip 102 and lead frame chip pad 104 are surrounded by a low modulus molding compound (LMMC) 118. The LMMC has a modulus much less than the modulus of IC package molding compounds, as is further described hereinbelow. The IC chip 102, lead frame chip pad 104 and LMMC 118 are then encapsulated with IC package molding compound 120. Note that although the term "encapsulated" is used to describe the process of forming the IC package molding compound 120, the package molding compound does not encase the entire device. Instead, the package molding compound covers at least the IC chip 102, the LMMC 118 and the wire bonds 112 and 114, while portions of the device are not covered, such as 106 described hereinbelow. The package molding compound 120 can be described as "overmolded" because as the device is oriented as shown in FIG. 1A, the package molding compound 120 covers the upper portion but not the bottom portion. The LMMC 118 that surrounds the IC chip 102 forms a stress buffer layer between the IC package molding compound 120 and the IC chip 102. The LMMC 118 deforms when shrinkage occurs during curing and cooling of the IC package molding compound 120, thus reducing stress that is applied to the IC chip 102 by the IC package molding compound 120.

The lead frame in the low stress PIC 100 is a trilayer lead frame comprised of a base sublayer 106, a chip sublayer 108, and a cap sublayer 110. The chip sublayer 108 contains a chip attach pad 104 and lead frame leads 116. When the three trilayer lead frame sublayers, 106, 108, 110 are stacked, the openings in each sublayer merge to form a reservoir that surrounds the chip attach pad 104. In alternative arrangements, additional sublayers can be used to form a lead frame with more than three layers, for example, four layers or more layers can be used. The reservoir is filled with LMMC 118 after the IC chip 102 is attached to the chip attach pad 104 and prior to covering the LMMC with IC package molding compound 120. Each of the three sublayers, 106, 108, 110 is composed of a lead frame (usually copper or a copper alloy) embedded in a premold compound 124 such as epoxy or polyimide. The thickness of the premold compound 124 is approximately the same as the thickness of the lead frame in the sublayers. In this example, the premold compound layers are about 200 ums thick. There are three sublayers of approximately equal thickness to reach a total thickness of about 600 ums. The LMMC in the example is about 600 ums thick, as the reservoir is formed by the three sublayers stacked together.

Figure 1B:
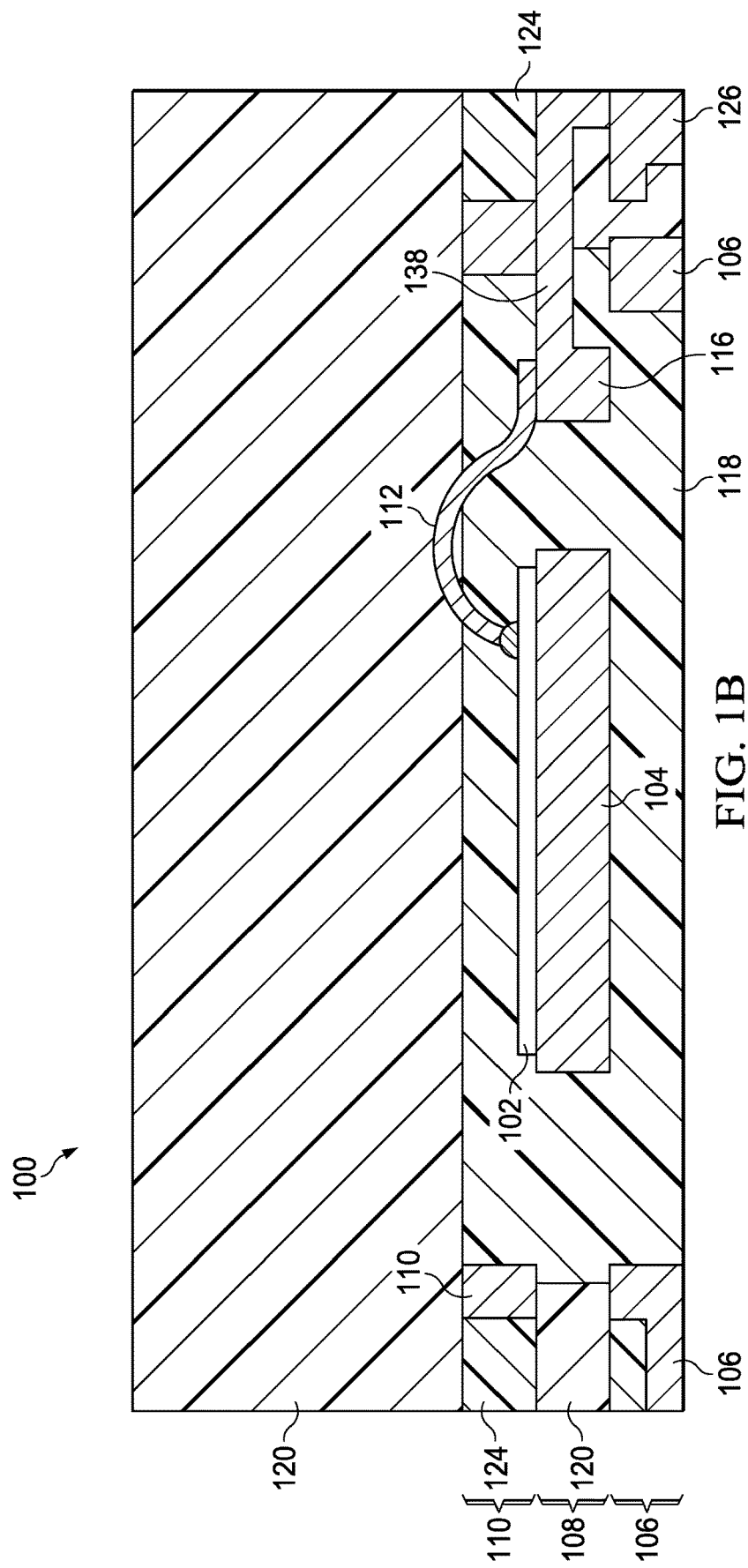

FIG. 1B is a cross section of the low stress PIC in FIG. 1A taken along the dashed line, 1B-1B', through the IC chip 102, through wire bond 112, through the first lead frame lead pad 116 and through the lead frame lead 126. A portion 138 of the first lead frame lead pad 116 in the chip sublayer 108 is cut to a lead frame half thickness to prevent shorting to the base sublayer 106. The underside (as oriented in FIG. 1B) of the lead frame lead 126 is later soldered to a lead on a printed circuit board to provide an electrical connection to the IC chip 102. In an example, a die attach process using a die attach adhesive (not shown) with a final thickness of 50 ums or more attaches the IC chip 102 to the chip sublayer.

Figure 2A:
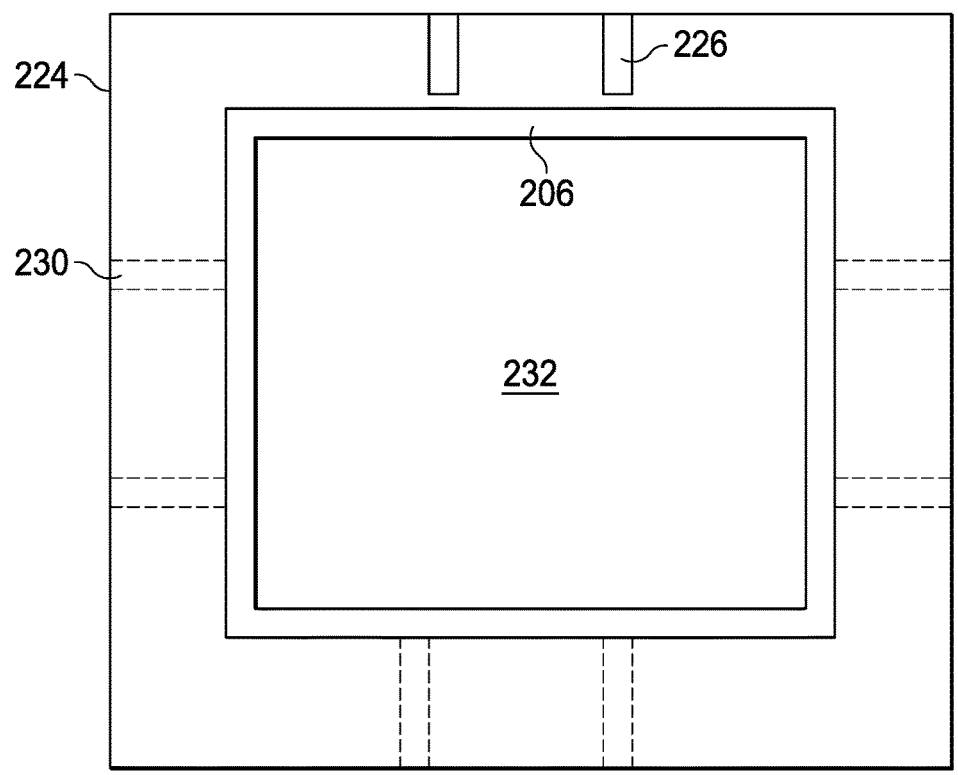
FIGS. 2A through 2C are plan views of the upper surface of the sublayers in a lead frame.
Figure 2A:
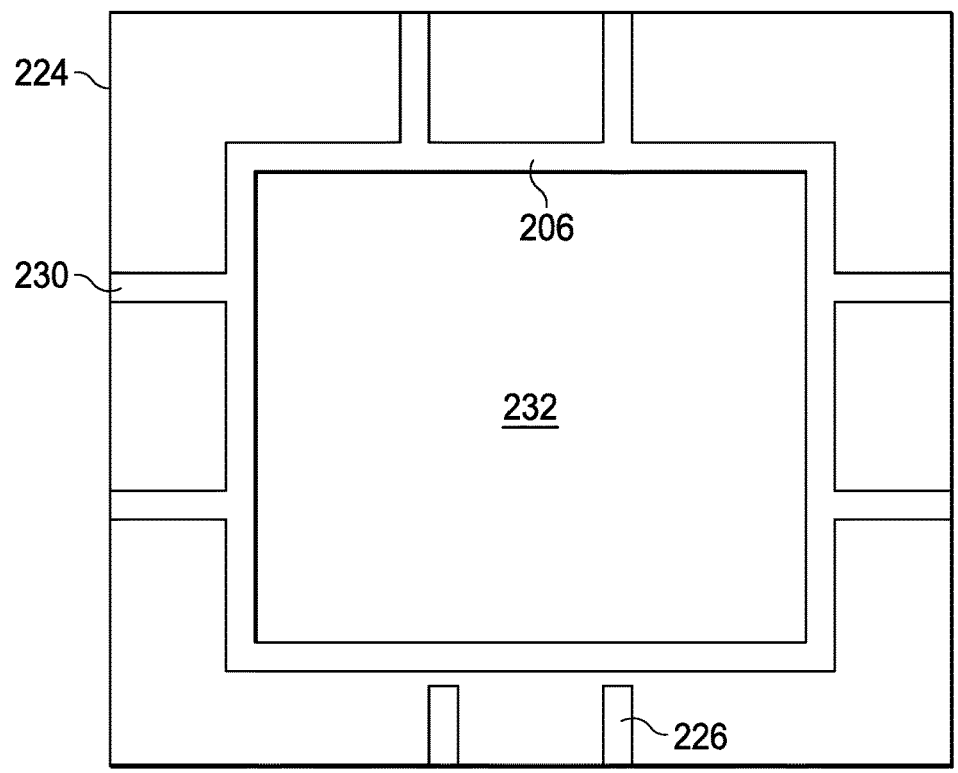
Figure 2B:
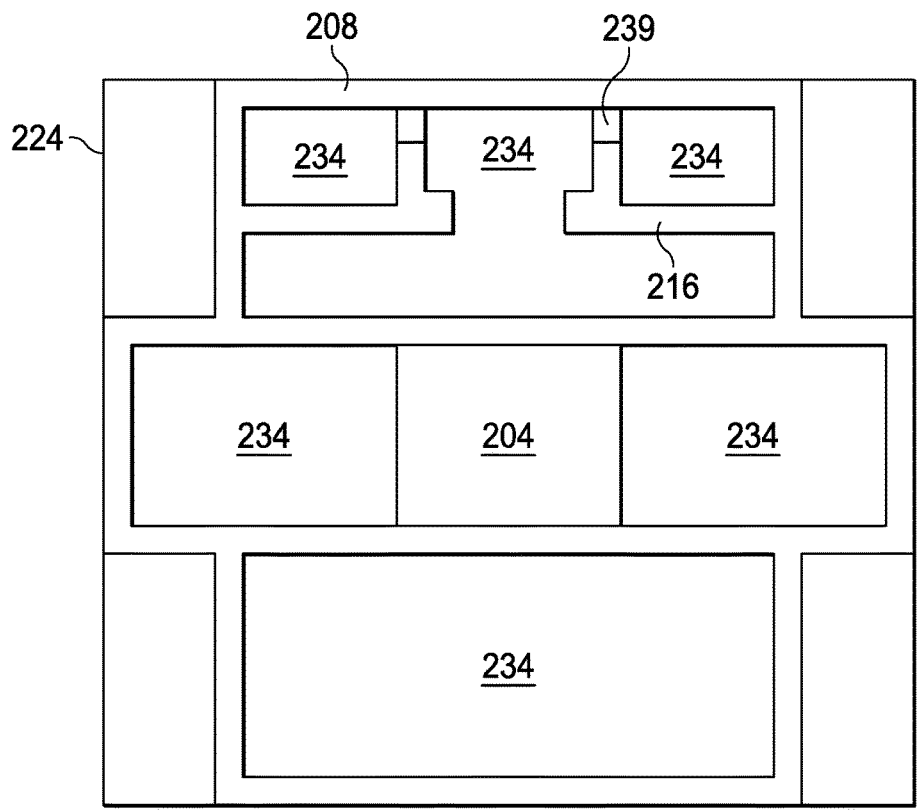
Figure 2B:
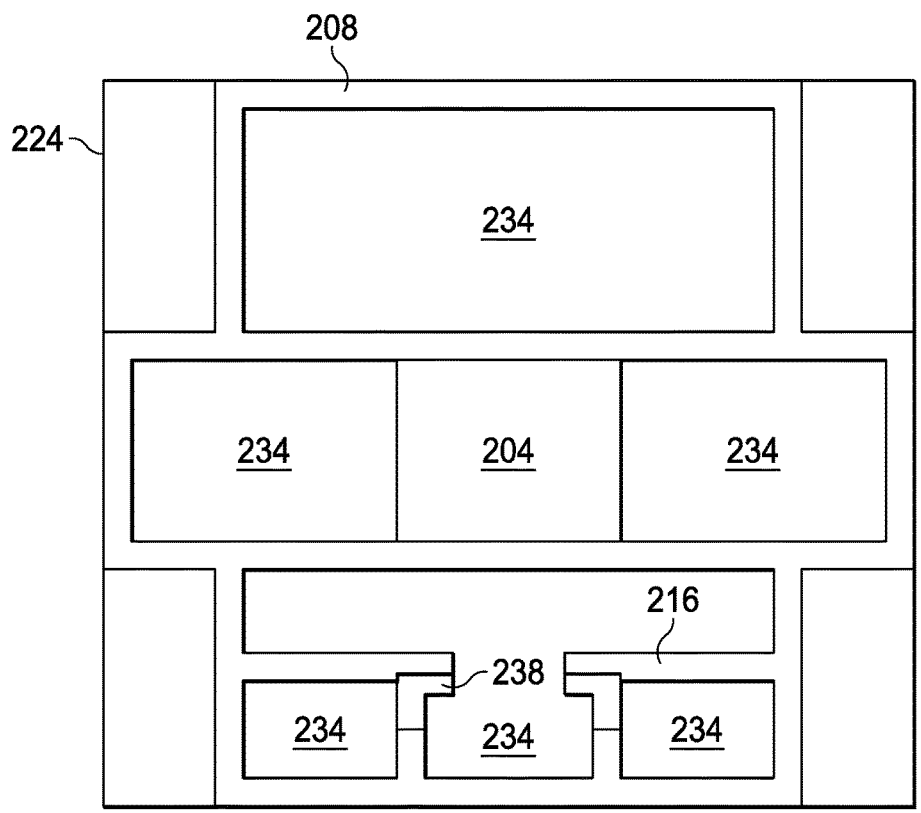
Figure 2C:
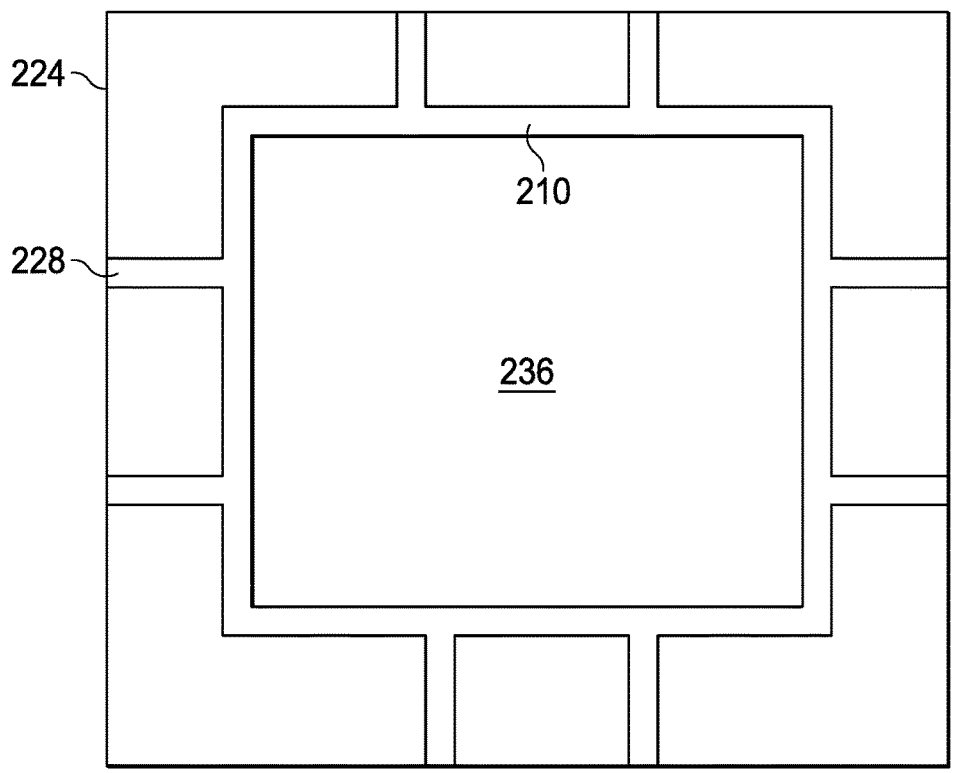
Figure 2C:
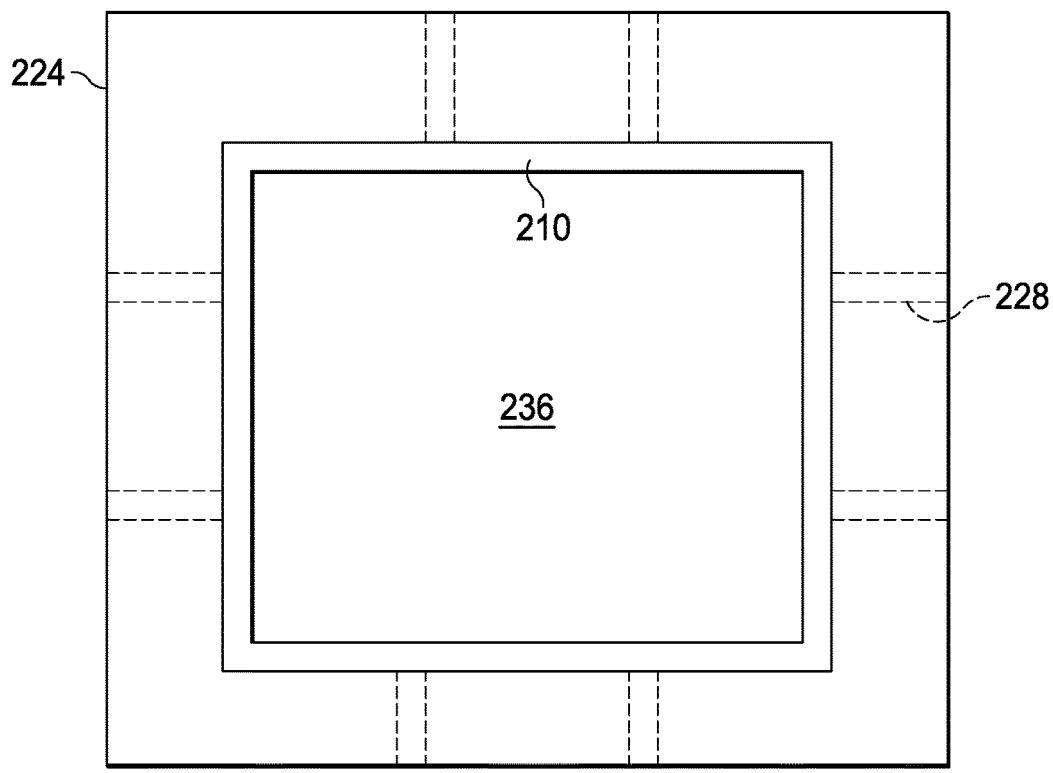
Figure 2D:
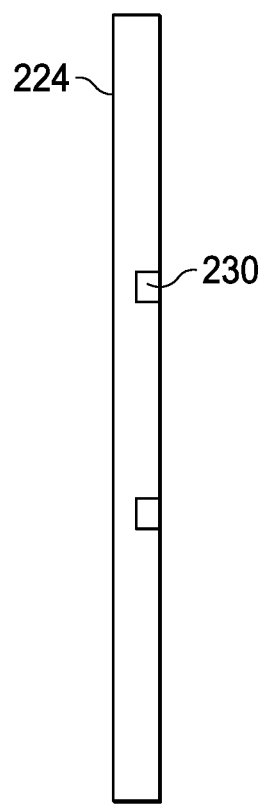
FIGS. 2D and 2DD are edge views of the base sublayer.
Figure 2D:
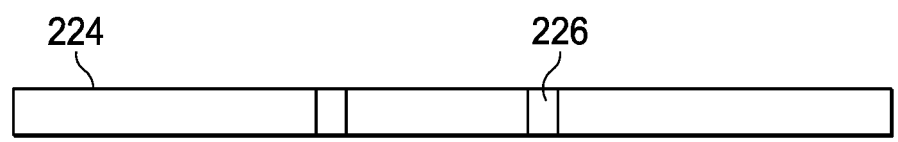

FIGS. 2A through 2D and 2AA through 2DD illustrate in more detail the sublayers of a trilayer lead frame. FIGS. 2A through 2C are plan views of the upper side (see orientation of sublayers 106, 108, and 110 in FIG. 1B) of each lead frame sublayer, 206 (base), 208 (chip), and 210 (cap). FIGS. 2AA through 2CC are plan views of the lower side (see orientation of sublayers 106, 108, and 110 in FIG. 1B) of each lead frame sublayer 206, 208, and 210. FIGS. 2D and 2DD illustrate views of edges of the base sub layer 206. In FIGS. 2A through 2D, similar reference labels are used for similar elements shown in FIG. 1, for clarity. For example, trilayer lead frame sublayers 206, 208, and 210 in FIGS. 2A through 2D correspond to trilayer lead frame sublayers 106, 108, and 110 in FIG. 1B. Other trilayer lead frame designs with a reservoir for LMMC are possible and form alternative arrangements. In addition, lead frames with more than three sublayers can be used to form alternative arrangements.

Figure 3A:
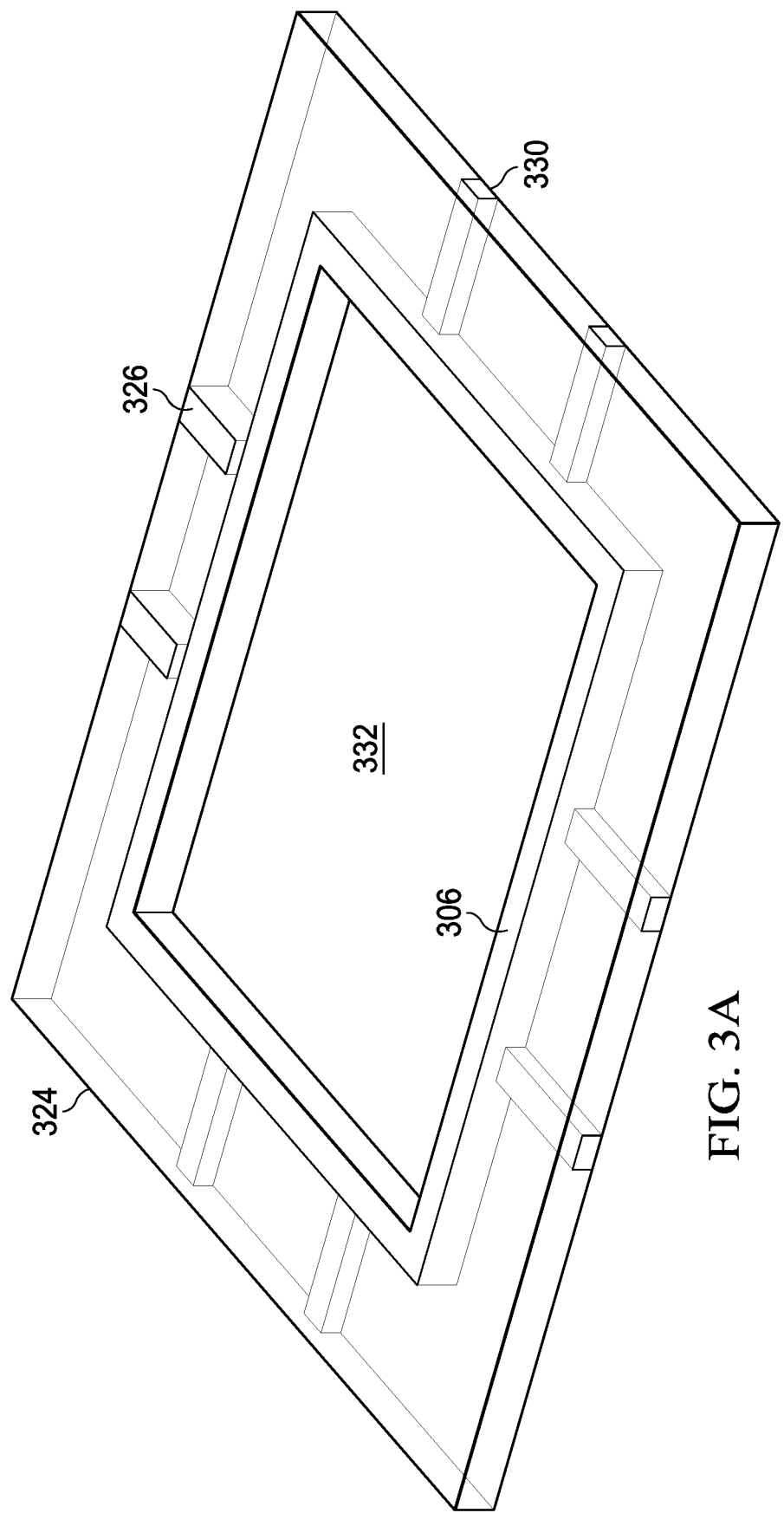
FIGS. 3A through 3C are perspective views of example lead frame sublayers.
Figure 3B:
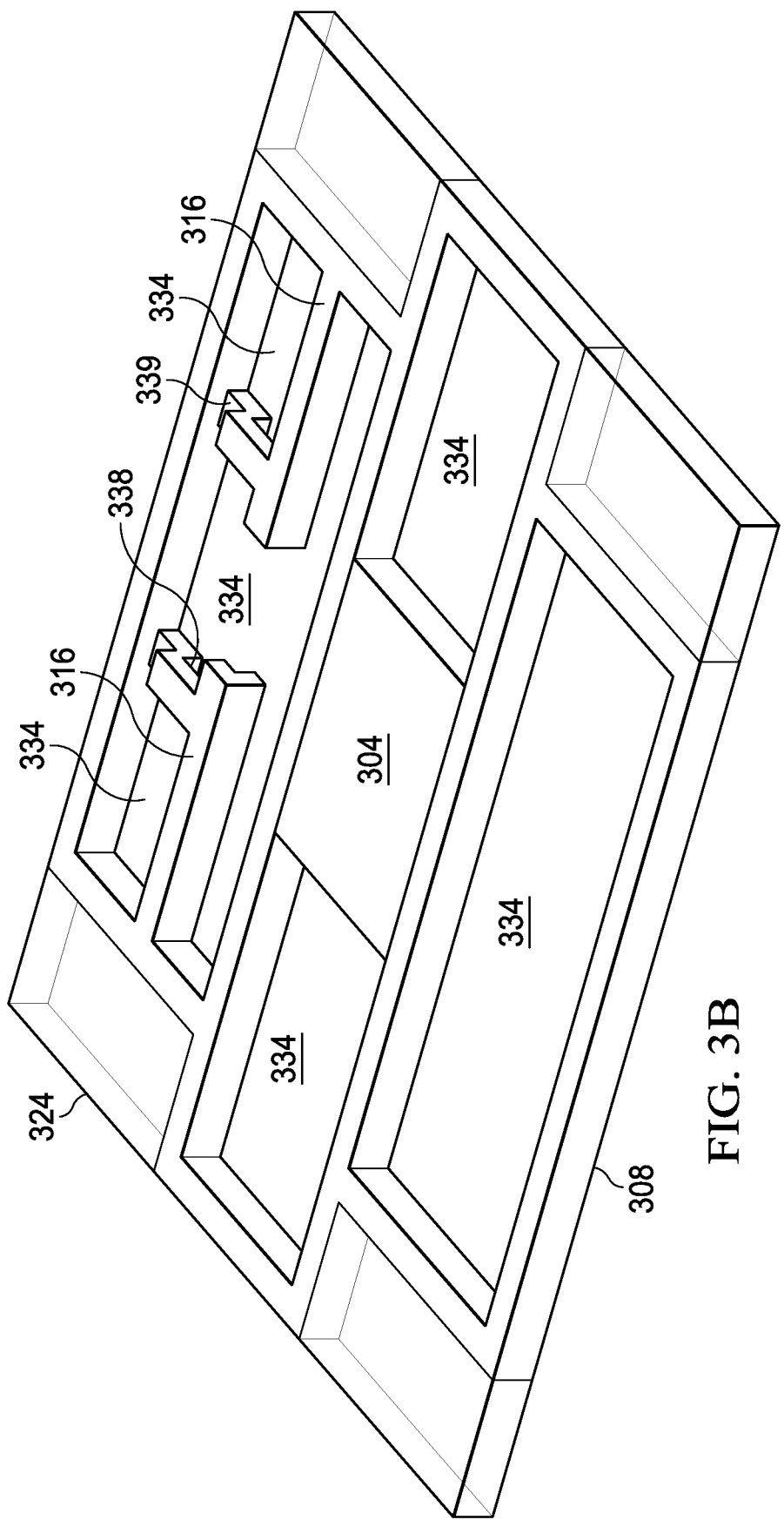
Figure 3C:
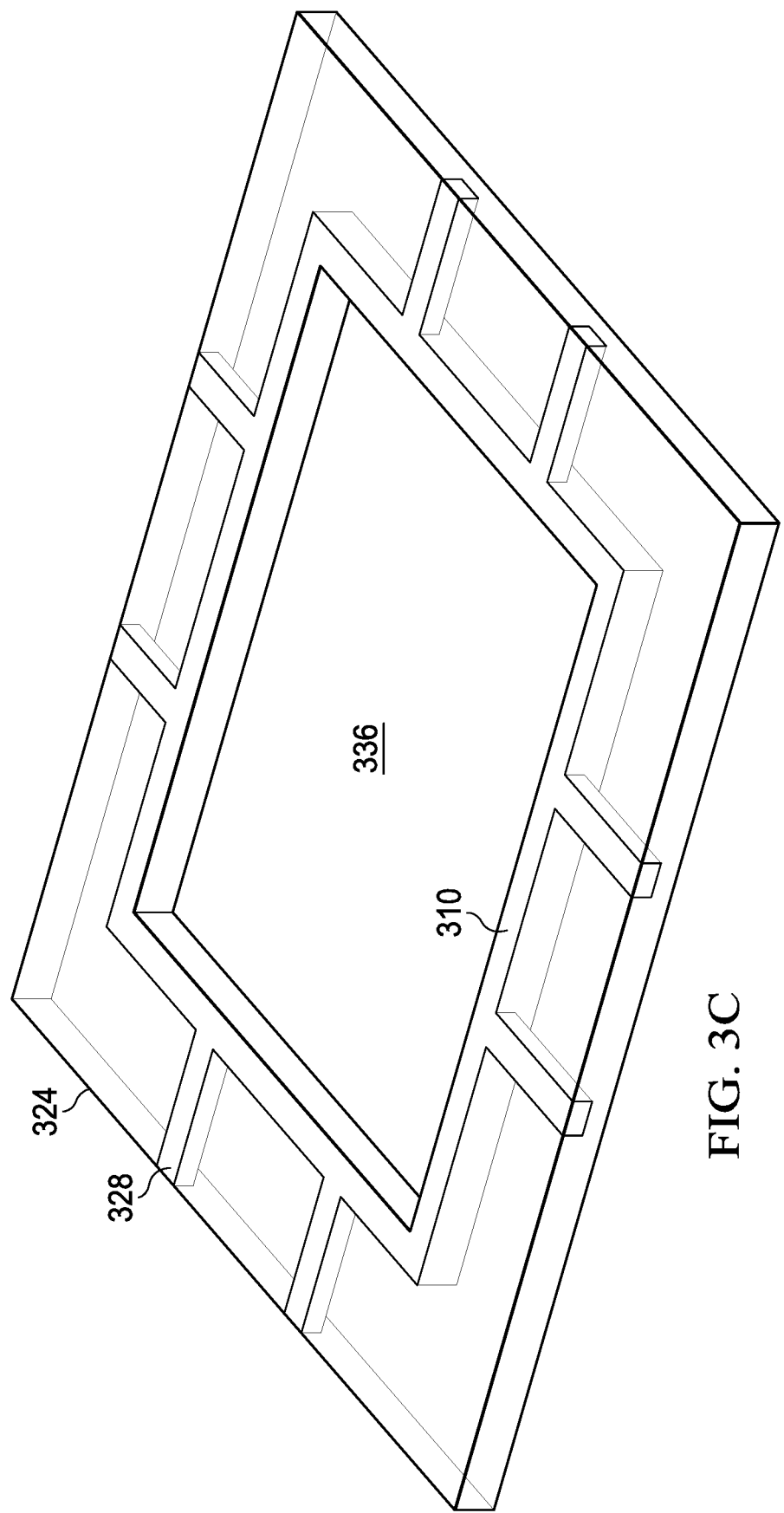

FIGS. 3A through 3C provide prospective views of each of sublayer, 306, 308, and 310 in a trilayer lead frame. In FIGS. 3A through 3C, similar reference labels are used for similar elements shown in FIG. 1, for clarity. For example, trilayer lead frame sublayers 306, 308, and 310 in FIGS. 3A through 3C correspond to trilayer lead frame sublayers 206, 208, and 210 in FIGS. 2A through 2C and correspond to trilayer lead frame sublayers 106, 108, and 110 in FIG. 1B.

FIG. 2A shows the upper side (see orientation of base sublayer 106 in FIG. 1B) of base sublayer 206 and FIG. 2AA shows the lower side (see orientation of base sublayer 106 in FIG. 1B) of the base sublayer 206. The first lead frame in the base layer 206 is typically made of copper or a copper alloy. The base sublayer 206 is comprised of a first lead frame that encloses a first open 232 rectangle and is surrounded by a premold compound 224 of approximately the same thickness such as an epoxy or polyimide. The premold compound 224 extends from the outside border of the lead frame enclosing the first open rectangle to the edges of the base sublayer 206. The first rectangle is at least 0.05 mm larger than the chip attach pad 204 (FIG. 2B) to provide an adequate thickness of LMMC surrounding the IC chip 102 for stress relief when the LMMC reservoir is filled. Two lead frame reinforcement bars 230 (drawn in FIG. 2A with a dashed outline to indicate a thickness about half the thickness of the base sublayer 206) extend from one of the long sides of the first rectangle to the edge of the base sublayer 206. Two lead frame reinforcement bars 230 with a thickness about half the thickness of the base sublayer 206 extend from each of the two shorter sides of the first rectangle to the edge of the base sublayer 206. Two lead frame leads 226 (drawn in FIG. 2A with a solid outline to indicate a thickness equal to the base sublayer 206) are electrically isolated from the first rectangle by a gap filled with premold compound 224 and extend to the outer edge of the base sublayer 206. These lead frame leads 226 will later be connected to lead frame lead pads 216 (see FIG. 2B) on the chip sublayer 208 to provide an electrical connection between the IC chip and a lead on a printed circuit board (PCB not shown). In this illustrative example two lead frame leads 226 are shown. More leads can be present if a different IC chip with more bond pads is packaged.

FIG. 2D shows a view of a short edge of base layer 206 containing reinforcement bars 230. The reinforcement bars 230 are about half the thickness of the base sublayer 206. The lower surface of the reinforcement bars 230 is exposed on the lower surface (see orientation of base sublayer 106 in FIG. 1B) of the base layer 206. The reinforcement bars 230 extend from the lower side of the base sublayer 206 about half way through the premold compound 224.

FIG. 2DD shows a view of a long edge of base sublayer 206 containing the lead frame leads 226. The thickness of the lead frame leads 226 is about the same as the thickness of the base sublayer 206. The lead frame leads 226 extend through the premold compound 224 from the lower side of the base sublayer 206 to the upper side of the base sublayer 206 (see orientation of base sublayer 106 in FIG. 1B). The lead frame leads 226 are electrically isolated from the chip attach pad 204 by an opening 234.

FIG. 3A provides a perspective view of base sublayer 306 with a first open rectangle 332 embedded in premold compound 324. Two reinforcement bars 330 with thickness of about half the thickness of the base sublayer 306 extend from the outer edge of each of three sides of the first open rectangle 332 to the outer edges of the base sublayer 306. Two lead frame leads 326 with a thickness about the same as the base sublayer 306 are embedded in the premold compound 324 outside the first open rectangle 332 and are electrically isolated from the outer edge of the first open rectangle 332 by a gap filled with premold material 324. The upper surface (as oriented in FIG. 3A) of these lead frame leads 326 is later bonded with a conductive adhesive to the lower surface (as oriented in FIG. 3B) of lead frame lead pads 316 (FIG. 3B) to form trilayer lead frame leads.

FIG. 2B shows the upper side (see orientation of chip sublayer 108 in FIG. 1B) of chip sublayer 208 and FIG. 2BB shows the lower side (see orientation of chip sublayer 108 in FIG. 1B) of the chip sublayer 208. The chip sublayer 208 is comprised of a second metal lead frame surrounded by a premold compound 224 such as an epoxy or polyimide. The second metal lead frame and the premold compound 224 are of approximately the same thickness. A chip attach pad 204 on which an IC chip will later be mounted is near the middle of chip sublayer 208. Surrounding the chip attach pad 204 are openings 234 that later merge with openings 232 in the base sublayer 306 and openings 236 in the cap sublayer 310 to form a LMMC reservoir. Two lead frame lead pads 216 that are electrically isolated from the chip attach pad 204 by an opening 234 and extend to the outer edge of the chip sublayer 208 will later be electrically connected to bond pads on an IC chip by wire bonds. As is illustrated in FIG. 2BB, a middle portion 238 of the two lead frame lead pads 216 is notched to about a half thickness to prevent shorting when it is mounted on the base sublayer 206. The openings 234 surrounding the chip attach pad 204 in the chip sublayer 208 later merge with the opening 232 in the base sublayer 206 and with the opening 236 in the cap sublayer 210 to form a LMMC reservoir.

FIG. 3B provides a perspective view of trilayer lead frame chip sublayer 308. The chip attach pad 304 is surrounded by openings 334 on all sides. Two lead frame lead pads 316 are electrically isolated from the chip attach pad 304 by an opening 334 and extend to the outer edge of the chip sublayer 308. A thickness of a central portion the lead frame lead pads 316 between the chip attach pad 304 and the outer edge of the chip sublayer 308 is notched to about a half thickness to prevent shorting to the first open 332 rectangle in the base layer 306 (FIG. 3A) when the trilayer lead frame is assembled.

FIG. 2C is a plan view of the upper side (see orientation of cap sublayer 110 in FIG. 1B) of cap sublayer 210 and FIG. 2CC is a plan view of the lower side (see orientation of cap sublayer 110 in FIG. 1B) of the cap sublayer 210. The third lead frame in the cap sublayer 210 is typically made of copper or a copper alloy. The cap sublayer 210 is comprised of a third lead frame with a second open 236 rectangle surrounded by a premold compound 224 of approximately equal thickness such as an epoxy or polyimide. The premold compound 224 extends from the outer edge of the lead frame surrounding the second open 236 rectangle to the outer edges of the cap sublayer 210. The second open 236 rectangle is at least 0.35 mm larger on all aides than the chip attach pad 204 (FIG. 2B) to provide an adequate thickness of LMMC for stress relief between the IC chip and the IC package molding compound. Two reinforcement bars 228 drawn with dashed outline in FIG. 2CC to indicate a thickness about half the thickness of the cap sublayer 210 lead frame extend from each of the sides of the lead frame surrounding the second open 236 rectangle to the outer edges of the cap sublayer 210. The surface of the reinforcement bars 228 is exposed on the upper surface (see orientation of cap sublayer 110 in FIG. 1B) of the cap sublayer 210. The reinforcement bars 228 extend about half way through the premold compound 224 towards the lower surface (see orientation of cap sublayer 110 in FIG. 1B) of the cap sublayer 210.

FIG. 3C provides a perspective view of cap sublayer 310 with the second open 336 rectangle embedded in premold compound 324. The second open 336 rectangle and the premold compound 324 are about the same thickness. Two reinforcement bars 328 with thickness about half the thickness of the cap sublayer 310 extend from each of the sides of the second lead frame surrounding the second open 336 rectangle to the outer edges of the cap sublayer 310. The upper surface of the reinforcement bars 328 is exposed on the upper surface of the cap sublayer 310 (see orientation of cap sublayer 110 in FIG. 1B). The reinforcement bars 328 extend toward the lower surface (see orientation of cap sublayer 110 in FIG. 1B) of the cap sublayer 310 about half way through the premold compound 324.

Figure 4:
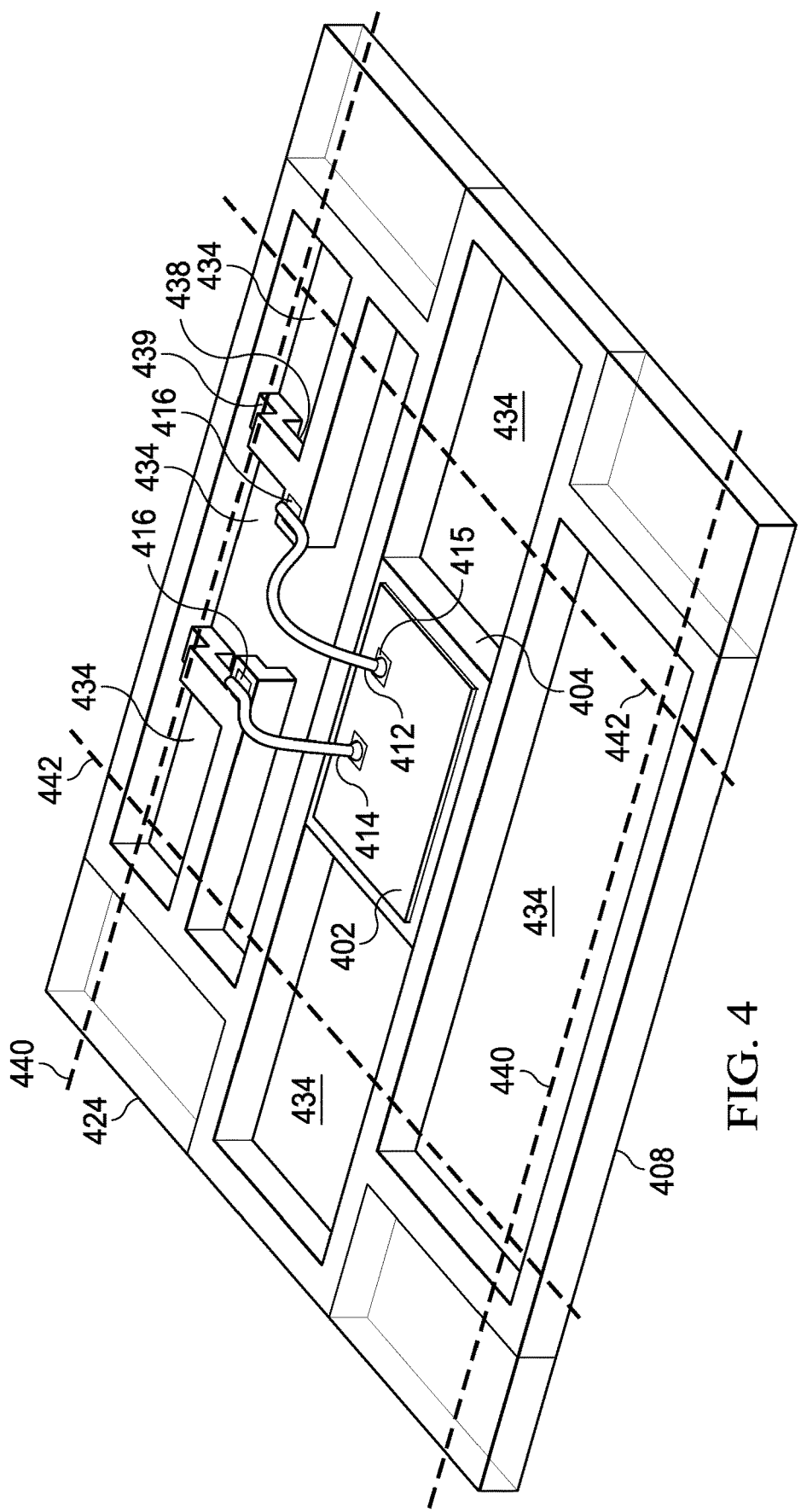
FIG. 4 is a perspective view of an example chip sublayer with an IC chip bonded to it.

FIG. 4 illustrates the chip sublayer 408 with an IC chip 402 mounted on the chip attach pad 404. In FIG. 4, similar reference labels are used for similar elements in FIG. 1B for clarity. For example, chip attach pad 404 in FIG. 4 corresponds chip attach pad 104 in FIG. 1B. IC chip 402 is mounted on chip attach pad 404. Wire bonds 412 and 414 electrically connect bond pads 415 on the IC chip 402 to lead frame lead pads 416. Horizontal cut lines 440 and vertical cut lines 442 illustrate where the chip sublayer 408 will be later sawed after encapsulation to singulate the low stress PICs. The saw cuts remove portions of the second lead frame that otherwise would short the lead frame lead pads 416 to each other and short them to the chip attach pad 404.

Figure 5:
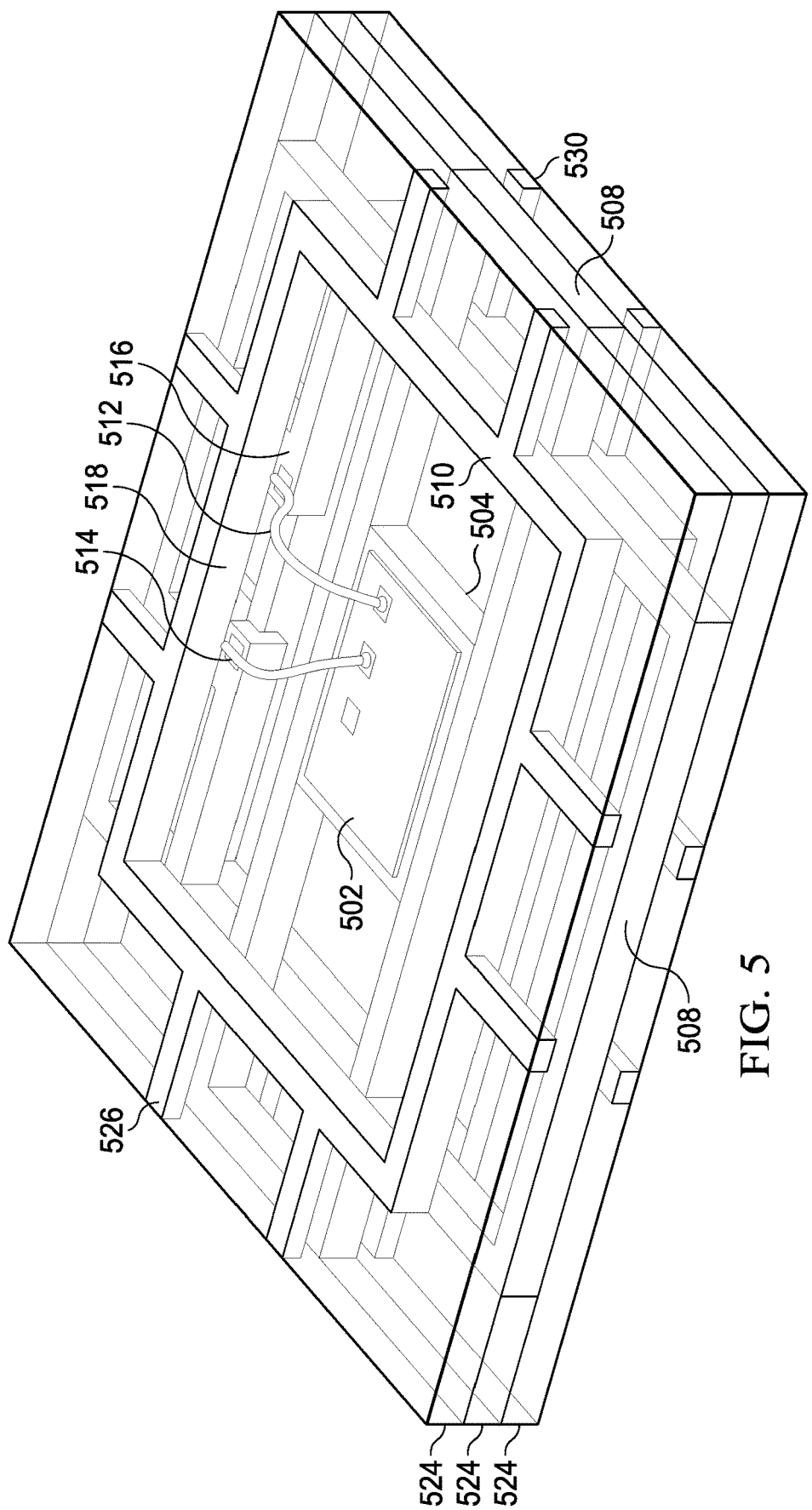
FIG. 5 is a perspective view of an example lead frame with the reservoir filled with low modulus molding compound.

FIG. 5 illustrates the assembly of the base sublayer 506, the chip sublayer 508 and the cap sublayer 510 to form a trilayer lead frame with a reservoir that surrounds the IC chip 502 and the chip attach pad 504. In FIG. 5, similar reference labels are used for similar elements in FIG. 1B for clarity. For example, chip sublayer 508 FIG. 5 corresponds chip sublayer 108 in FIG. 1B. IC chip 402 is mounted on chip attach pad 404.

When the reservoir is filled with LMMC 518, a stress buffer layer of the low modulus molding compound surrounds the IC chip 502. The LMMC material 518 can be an epoxy or polyimide with a modulus in the range of about 1000 to 3000 MPa. In an arrangement the low modulus of LMMC 518 enables the LMMC 518 to deform as the IC package MC shrinks during curing and cooling. The deformation buffers the stress between IC package molding compound (with the range of about 30,000 to 50,000 MPa) and the IC chip 502.

The trilayer lead frame can be assembled by applying a nonconductive adhesive between the base sublayer 506 and chip sublayer 508; and between the chip sublayer 508 and the cap sublayer 510. A conductive adhesive is used to bond the lead frame lead pad 516 on the chip sublayer 508 to the lead frame lead (See lead frame lead pad 116 and lead frame lead 126 in FIG. 1B) on the base sublayer 506 to form a trilayer lead frame lead.

Figure 6:
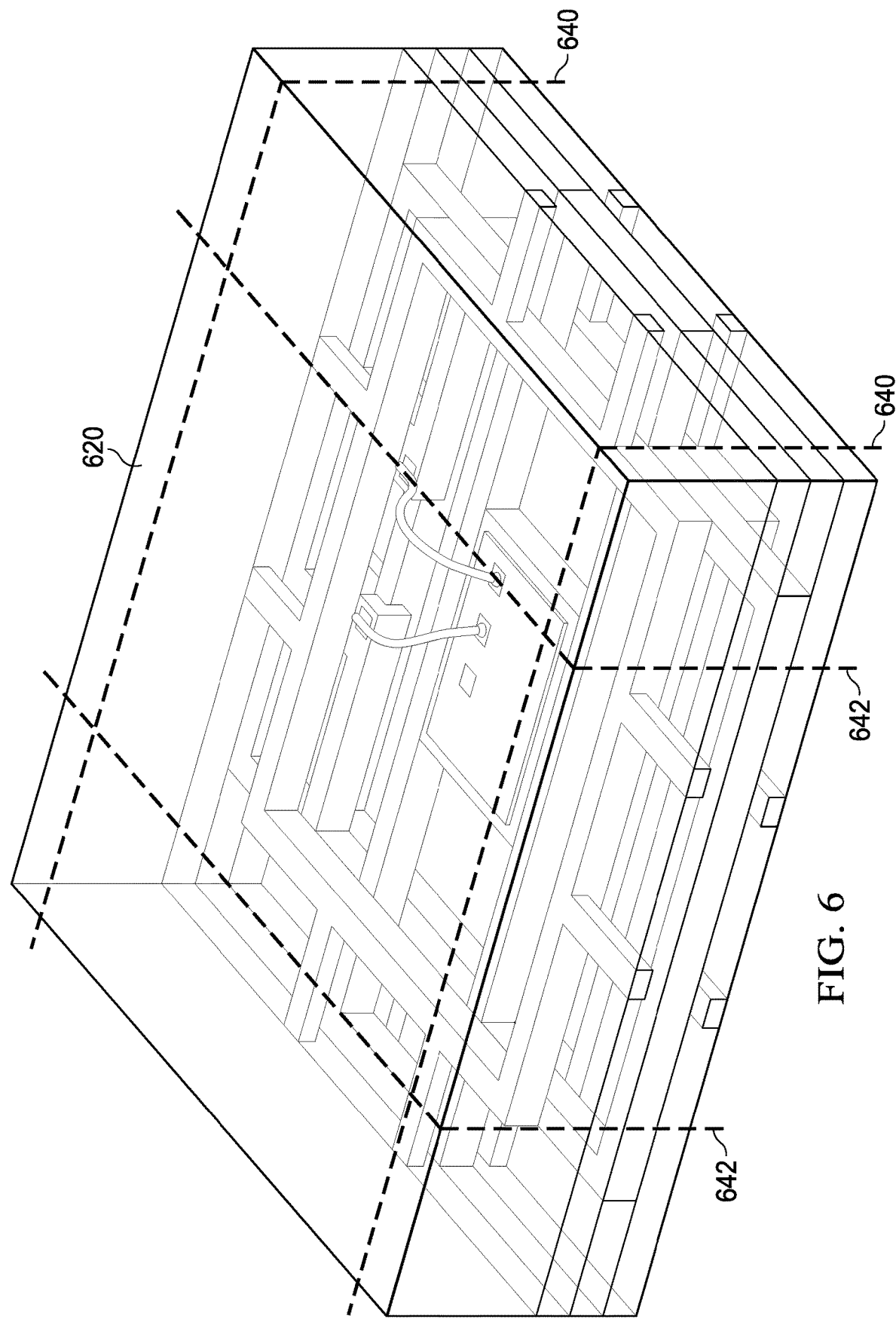
FIG. 6 is a perspective view of an example low stress packaged IC prior to singulation.

FIG. 6 is a projection view of the trilayer lead frame with LMMC after encapsulation with IC package MC 620. Horizontal cut lines 640 and vertical cut lines 642 show where cuts can be made to singulate the encapsulated low stress PICs into individual low stress PIC units.

In the examples described herein, a trilayer lead frame is shown having three sublayers. In alternative arrangements, the lead frame can include additional sublayers in addition to those described herein. Four, five or more sublayers can be used.

Figure 7:
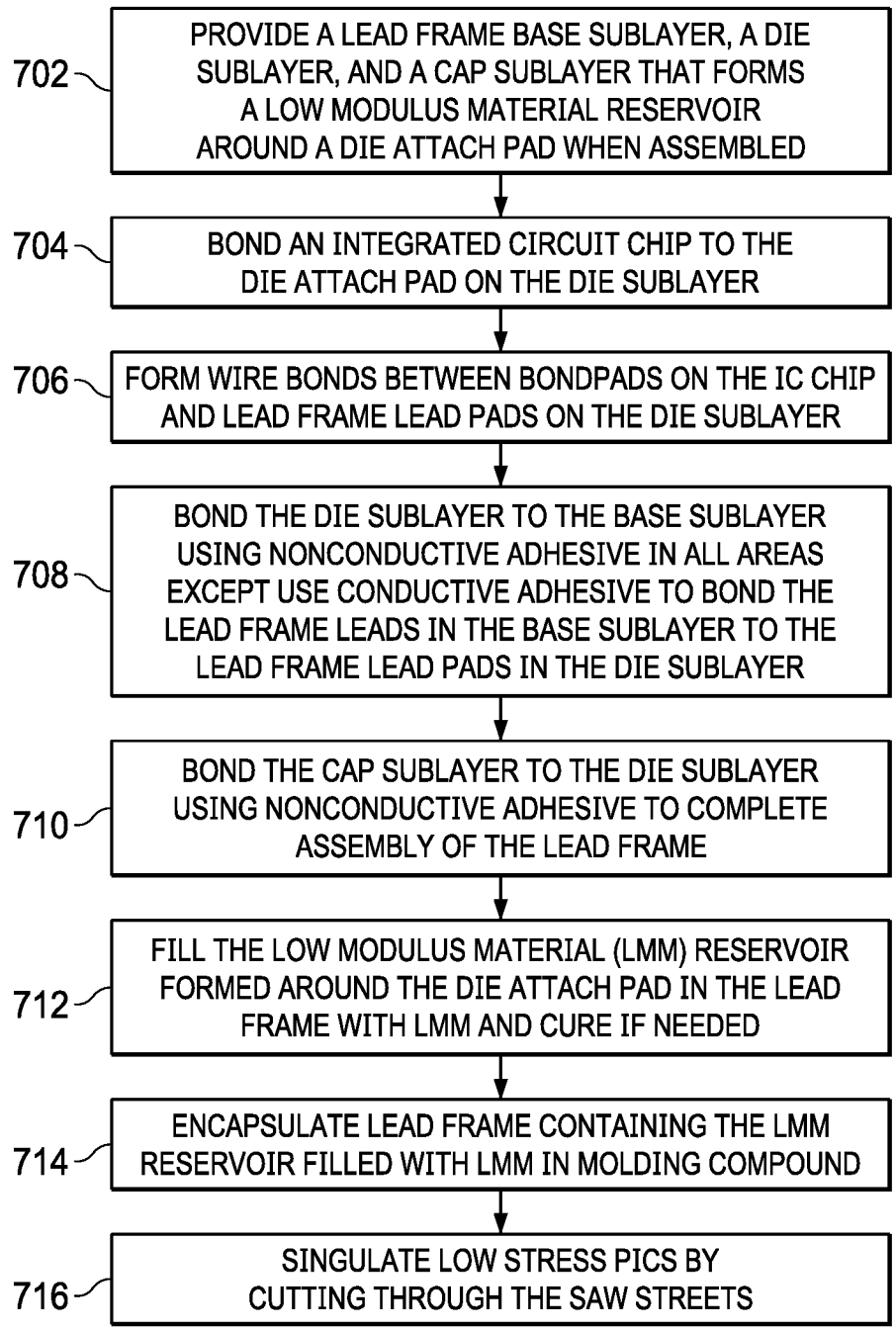
FIG. 7 is a flow diagram of an example method for forming a low stress integrated circuit package.

FIG. 7 illustrates an example method for forming a low stress PIC.

In step 702 a base sublayer, a chip sublayer, and a cap sublayer are formed. These three sublayers are then assembled to form a trilayer lead frame with a LMMC reservoir surrounding the chip attach pad.

In step 704 an IC chip is bonded to the chip attach pad on the chip sublayer. A die attach process including a die attach adhesive between the chip and the chip attach pad of a final thickness of about 50 ums or more bonds the chip to the chip attach pad.

In step 706 bond pads on the IC chip are electrically coupled to lead frame lead pads on the chip sublayer using bond wires.

In step 708 a nonconductive adhesive is used to bond the chip sublayer to the base sublayer. A conductive adhesive is used to bond a lower surface (like orientation of chip sublayer 108 in FIG. 1B) of lead frame lead pads in the chip sublayer to an upper surface (like orientation of base sublayer 106 in FIG. 1B) of lead frame leads in the base sublayer to form trilayer lead frame leads.

In step 710 the underside (in an orientation like the orientation of cap sublayer 110 in FIG. 1B) of the cap lead frame layer is bonded to the upper side (like the orientation of chip sublayer 108 in FIG. 1B) of the chip 1 sublayer using a nonconductive adhesive such as an epoxy or polyimide. Openings in the three sublayers merge to form a reservoir surrounding the IC chip and the chip attach pad. This completes assembly of the trilayer lead frame.

In step 712 the reservoir in the trilayer lead frame is filled with LMMC. The LMMC is cured at an elevated temperature if required. The LMMC has a modulus in the range of about 1,000 to 3,000 MPa.

In step 714 the trilayer lead frame is encapsulated in IC package molding compound. The IC package molding compound typically has a modulus in the range of 30,000 to 50,000 MPa. The IC package compound covers a portion of the device but does not completely encase the device. As described hereinabove, portions of the device are not covered by the IC package compound. External portions of the leadframe are left exposed to form terminals for electrical connection the IC chip within the IC package, for example.

In step 716 individual low stress PICs are singulated by cutting through the saw streets using a process such as sawing or laser cutting.

The trilayer lead frame forms a cavity that surrounds the IC chip on the chip attach pad. Use of LMMC to fill the cavity and to surround the IC chip with low modulus material enables a low stress packaged IC. The low modulus molding compound forms a stress buffer layer between the high modulus package molding compound and the IC chip. As the high modulus package molding compound shrinks during curing and cooling, the stress buffer layer deforms and absorbs a portion of the stress that is transmitted from the high modulus package molding compound to stress sensitive circuits in the IC chip.

Modifications are possible in the described arrangements, and other alternative arrangements are possible within the scope of the claims.

What is claimed is:

1. An integrated circuit (IC) package, comprising:
   an IC chip bonded to a chip attach pad of a lead frame;
   a first molding compound having a modulus between about 1,000 and 3,000 MPa surrounding the IC chip; and
   a second molding compound covering the IC chip, and at least a portion of the first molding compound; in which:
   the lead frame further includes a base sublayer with at least a first opening, a chip sublayer with the chip attach pad surrounded by second openings, and a cap sublayer with at least a third opening and the first opening, the second openings, and the third opening form a reservoir; and
   the cap sublayer is comprised of a first lead frame and a first premold compound, the chip sublayer is comprised of a second lead frame and a second premold compound, and the base sublayer is comprised of a third lead frame and a third premold compound.

2. The integrated circuit package of claim 1, in which a thickness of the first molding compound between the IC chip and the second molding compound is at least 0.6 mm.

3. The integrated circuit package of claim 1, in which the cap sublayer is bonded to the chip sublayer, the chip sublayer is bonded to the base sublayer; and where the first opening, the second openings, and the third opening form the reservoir; and the reservoir is filled with the first molding compound.

4. The integrated circuit package of claim 1, in which a first thickness of the first lead frame and the first premold compound, a second thickness of the second lead frame and the second premold compound, a third thickness of the third lead frame and the third premold compound have substantially a same thickness.

5. The integrated circuit package of claim 1 in which the first premold compound is one selected from an epoxy and a polyimide.

6. The integrated circuit package of claim 1, wherein the first molding compound is a stress buffer layer between the IC chip and the second molding compound.

7. The integrated circuit package of claim 1, wherein the first molding compound surrounds the chip attach pad from six sides of the chip attach pad.

8. The integrated circuit package of claim 1, wherein the first molding compound directly contacts a bottom surface of the chip attach pad that is opposite to a top surface of the chip attach pad to which the IC chip is bonded to.

9. The integrated circuit package of claim 1, wherein the first molding compound directly contacts a bottom surface of the chip attach pad.

10. An integrated circuit (IC) package, comprising:
    a lead frame containing a reservoir with a chip attach pad surrounded by the reservoir;
    an IC chip bonded to the chip attach pad, surrounded by the reservoir filled with a first molding compound having a modulus between about 1,000 and 3,000 MPa, the first molding compound covering the chip attach pad in which the first molding compound contacts a bottom surface of the chip attach pad that is opposite to a top surface of the chip attach pad to which the IC chip is bonded to; and
    a second molding compound covering the first molding compound, in which:
    the lead frame further includes a cap sublayer having first openings bonded to a chip sublayer having second openings and the chip sublayer bonded to a base sublayer having third openings, and where the first openings, second openings and third openings merge to form the reservoir; and
    the cap sublayer is comprised of a first lead frame and a first premold compound, the chip sublayer is comprised of a second lead frame and a second premold compound, and the base sublayer is comprised of a third lead frame and a third premold compound.

11. The integrated circuit package of claim 10, in which a thickness of the first molding compound between the second molding compound and the IC chip is at least 0.6 mm.

12. The integrated circuit package of claim 10, in which a thickness of the first lead frame and the first premold compound, a thickness of the second lead frame and the second premold compound, a thickness of the third lead frame and a thickness of the third premold compound are approximately a same thickness.

13. The integrated circuit package of claim 10 in which the first premold compound is one selected from an epoxy and a polyimide.

14. The integrated circuit package of claim 10, wherein the lead frame includes a lead bonded to a lead frame lead pad of the chip sublayer and to a base sublayer lead frame lead with conductive adhesive.

15. An integrated circuit (IC) package, comprising:
    an IC chip attached to a chip attach pad of a lead frame;
    a first molding compound having a modulus between about 1,000 and 3,000 MPa surrounding the IC chip, in which the first molding compound directly contacts a bottom surface of the chip attach pad that is opposite to a top surface of the chip attach pad to which the IC chip is bonded to; and
    a second molding compound covering the IC chip, and at least a portion of the first molding compound, wherein:
    the lead frame further includes a base sublayer with at least a first opening, a chip sublayer with a chip attach pad surrounded by second openings, and a cap sublayer with at least a third opening and the first opening, the second openings, and the third opening form a reservoir; and
    the cap sublayer is comprised of a first lead frame and a first premold compound, the chip sublayer is comprised of a second lead frame and a second premold compound, and the base sublayer is comprised of a third lead frame and a third premold compound.

16. The integrated circuit package of claim 15, wherein the first molding compound surrounds the chip attach pad from all sides.

17. The integrated circuit package of claim 15, wherein the first molding compound is capable of deforming in response to shrinkage.

18. The integrated circuit package of claim 15, wherein the first molding compound is a stress buffer layer between the IC chip and the second molding compound.

* * * * *